United States Patent [19]
Takahashi et al.

[11] Patent Number: 5,313,088
[45] Date of Patent: May 17, 1994

[54] VERTICAL FIELD EFFECT TRANSISTOR WITH DIFFUSED PROTECTION DIODE

[75] Inventors: Nobumitsu Takahashi; Mitsuasa Takahashi, both of Tokyo, Japan

[73] Assignee: NEC Corporation, Tokyo, Japan

[21] Appl. No.: 762,208

[22] Filed: Sep. 19, 1991

[30] Foreign Application Priority Data

Sep. 19, 1990 [JP] Japan .................................. 2-249091
Jun. 3, 1991 [JP] Japan .................................. 3-130123

[51] Int. Cl.⁵ ...................... H01L 29/10; H01L 29/34
[52] U.S. Cl. .................................. 257/328; 257/365; 257/394; 257/409
[58] Field of Search ............... 257/266, 264, 328, 329, 257/364, 366, 394, 409, 412, 546, 547

[56] References Cited

U.S. PATENT DOCUMENTS

| | | | |
|---|---|---|---|
| 4,414,560 | 11/1983 | Lidow | 257/409 |
| 4,789,882 | 12/1988 | Lidow | 257/328 |
| 5,162,883 | 11/1992 | Fujihira | 257/336 |
| 5,169,793 | 12/1992 | Okabe et al. | 257/328 |

FOREIGN PATENT DOCUMENTS

| | | | |
|---|---|---|---|
| 59-207661 | 11/1984 | Japan | 257/328 |
| 38373 | 1/1991 | Japan | 257/328 |
| 3156977 | 7/1991 | Japan | 257/328 |

*Primary Examiner*—Rolf Hille
*Assistant Examiner*—Mahshid Saadat
*Attorney, Agent, or Firm*—Sughrue, Mion, Zinn, Macpeak & Seas

[57] ABSTRACT

A vertical field effect transistor of the structure having a gate pad and a gate finger, includes a semiconductor substrate of a first conduction type, and a first diffusion region of a second conduction type opposite to the first conduction type, formed in a principal surface of the substrate under the gate pad and the gate finger. A second diffusion region of the second conduction type is formed in the principal surface of the substrate and electrically connected to a source electrode so as to form a protection diode between the substrate and the second diffusion region. The second diffusion region is separated from the first diffusion region.

5 Claims, 5 Drawing Sheets

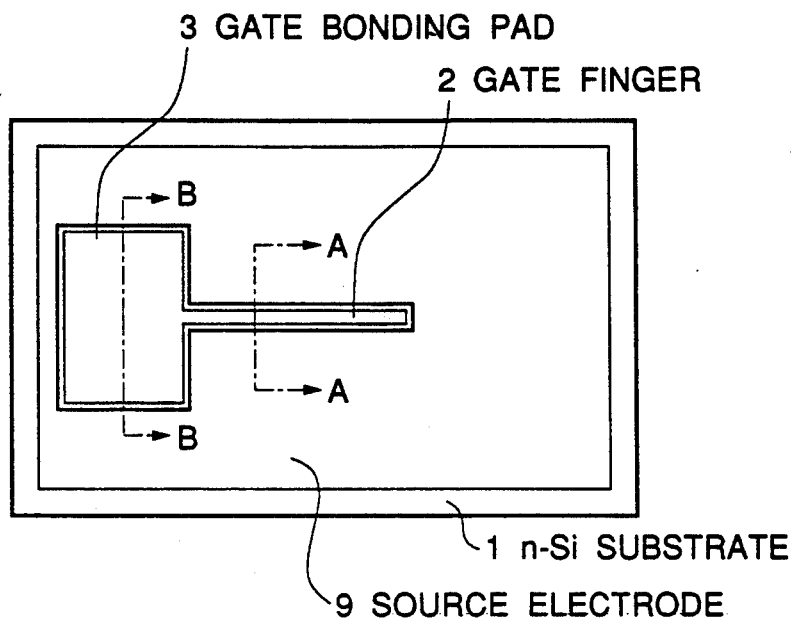
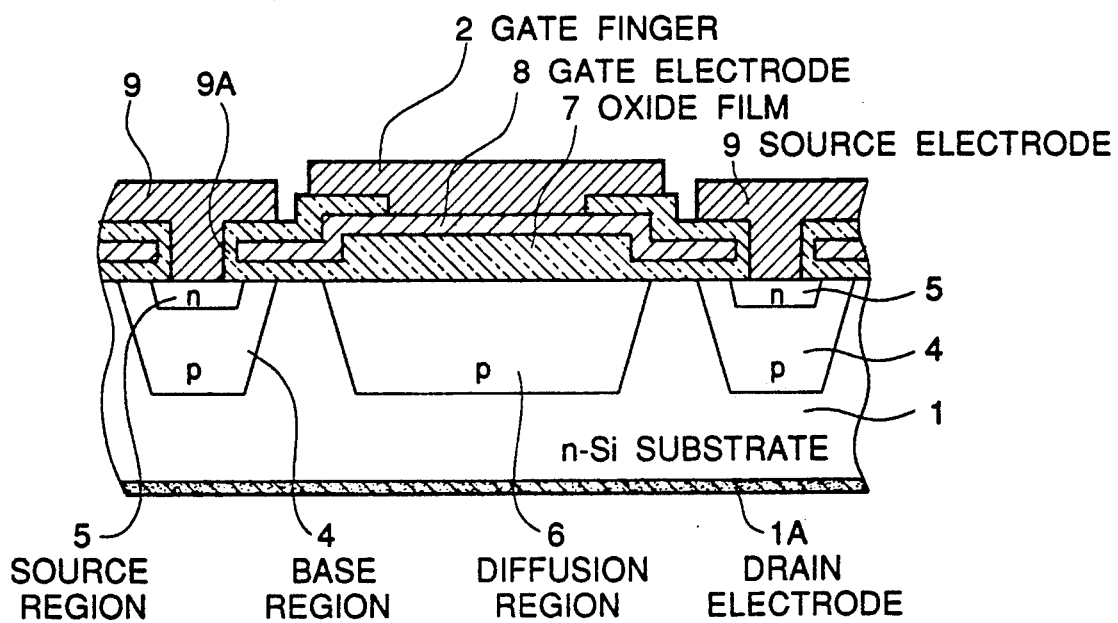

VERTICAL FIELD EFFECT TRANSISTOR WITH DIFFUSED PROTECTION DIODE

BACKGROUND OF THE INVENTION

1. Field of the Invention

The present invention relates to a field effect transistor, and more specifically to a vertical MOS-FET (metal-oxide-semiconductor field effect transistor) having a gate bonding pad and a gate finger.

2. Description of Related Art

One typical conventional vertical double-diffused MOS-FET includes a number of cells formed in a silicon substrate of for example n-type and connected in parallel to one another. Each cell is formed of a p-type diffusion region formed in the n-type substrate and called a "base region", a n-type source region formed in the base region, and a gate electrode formed through a gate oxide film to bridge the source region and the substrate region. The substrate functions as a drain in common to all the cells.

In the above structure, the gate electrode is formed in common to the number of cells and connected at one end to a gate bonding pad formed of for example aluminum. The gate electrode is ordinarily formed of polysilicon and therefore has a relatively high resistivity. Accordingly, a gate serial resistance becomes large at a position remote from the gate pad. In order to solve this problem, the gate pad of aluminum is extended to form a gate finger overlapping the gate electrode. In this case, since no cell can be formed under the gate finger and the gate pad, a p-type diffusion region is formed under the gate finger in order to ensure connection of a depletion layer between cells. Therefore, a pn junction is formed between the substrate and a p-type diffusion region formed under the gate bonding pad and the gate finger.

In addition, a p-type diffusion region is also formed at a periphery of the substrate so as to form a source/drain protection diode which functions to protect the device from an overvoltage applied between a source and a drain and also to increase the breakdown voltage changing rate dv/dt. The peripheral p-type diffusion region is electrically connected to a source electrode and biased to a ground level. In the conventional vertical MOS-FET, therefore, the peripheral p-type diffusion region is formed continuous to the p-type diffusion region formed under the gate bonding pad and the gate finger.

The above mentioned vertical FET is often used in a DC servo motor driving circuit in the form of a full-bridge circuit as shown in FIG. 1. The shown full-bridge driving circuit includes a pair of FETs $Q_1$ and $Q_2$ connected in series between Vdd and the ground and another pair of FETs $Q_3$ and $Q_4$ connected in series between Vdd and the ground. A motor M is connected between a connection node between the FETs $Q_1$ and $Q_2$ and a connection node between the FETs $Q_3$ and $Q_4$.

When the FETs $Q_1$ and $Q_4$ are turned on and the FETs $Q_2$ and $Q_3$ are turned off, a current $I_1$ flows through the FET $Q_1$ to the motor M, and a current $I_2$ flows from the motor M through the FETs $Q_4$. In this situation, a rotation direction can be reversed by turning off the FETs $Q_1$ and $Q_4$ and turning on the FETs $Q_2$ and $Q_3$. Just after the FETs $Q_1$ and $Q_4$ are turned off, a counter electromotive force occurs because the motor is an inductive load. As a result, the source/drain protection diode in the FET $Q_3$ is biased in a forward direction, so that a diode current $I_3$ flows through the FET $Q_3$. This current becomes large if a switching speed (di/dt) is large. If the source/drain protection diode in the FET $Q_3$ is biased in a forward direction, minority carriers are injected into the n-type drain region (i.e., the substrate) from the peripheral p-type diffusion region electrically connected to the source electrode.

In this process, the carriers move within the p-type diffusion region before the carriers are drawn from the drain region. In this case, if a carrier mobility exceeds $200 \text{ A}/\mu\text{S}$, the carrier drawing efficiency is limited by a diffusion resistance of the p-type diffusion region (on the order of $200 \text{ m}\Omega/\square$). As a result, the carriers are concentrated into a cell portion contiguous to the p-type diffusion region formed under the gate bonding pad and the gate finger, and the cells are often broken down.

On the other hand, when the counter electromotive force is absorbed or disappears, namely when the biasing of the FET is restored or returned from a reverse direction to a forward direction, the minority carriers injected into the n-type drain region are pulled back to the p-type diffusion region. In this process, because of the internal resistance of the p-type diffusion region, the carriers are not effectively absorbed in a portion of the p-type diffusion region near to the cell section, and therefore, flow into the cells near to the gate pad and the gate finger, so as to turn on a parasitic bipolar transistor formed of the source region, the base region and the drain region. As a result, the cells are broken down.

SUMMARY OF THE INVENTION

Accordingly, it is an object of the present invention to provide a field effect transistor which has overcome the above mentioned defect of the conventional one.

Another object of the present invention is to provide a vertical MOS-FET capable of preventing a cell breakdown caused by the carrier concentration.

Another object of the present invention is to provide a vertical MOS-FET capable of preventing a cell breakdown caused by a parasitic bipolar transistor formed by electric charges injected from the diffusion region of the protection diode.

The above and other objects of the present invention are achieved in accordance with the present invention by a vertical field effect transistor of the structure having a gate pad and a gate finger, the vertical field effect transistor including a semiconductor substrate of a first conduction type, a first diffusion region of a second conduction type opposite to the first conduction type, formed in a principal surface of the substrate under the gate pad and the gate finger, a second diffusion region of the second conduction type formed in the principal surface of the substrate and electrically connected to a source electrode so as to form a protection diode between the second diffusion region and the substrate, the second diffusion region being electrically isolated from the first diffusion region.

With the above mentioned arrangement, since the first diffusion region formed under the gate pad and the gate finger is electrically isolated from the second diffusion region, the pn junction between the substrate and the first diffusion region does not function as the pn junction diode. Therefore, the carriers are prevented from being concentrated in the cell portion.

The above and other objects, features and advantages of the present invention will be apparent from the following description of preferred embodiments of the invention with reference to the accompanying drawings.

BRIEF DESCRIPTION OF THE DRAWINGS

FIG. 2 is a plan view of a first embodiment of the vertical double-diffused MOS-FET in accordance with the present invention;

FIG. 3 is a sectional view taken along the line A—A in FIG. 2;

DESCRIPTION OF THE PREFERRED EMBODIMENTS

Referring to FIG. 2, there is a plan view of a first embodiment of the vertical double-diffused MOS-FET in accordance with the present invention.

As shown in FIG. 2, a n-type silicon substrate 1 has an upper or principal surface, on which a gate finger 2 and a gate bonding pad 3 are formed integrally or continuously to each other. For example, the gate finger 2 and the gate bonding pad 3 are formed of aluminum. In addition, a source electrode 9 is formed to surround the gate finger 2 and the gate bonding pad 3.

Figure 1:
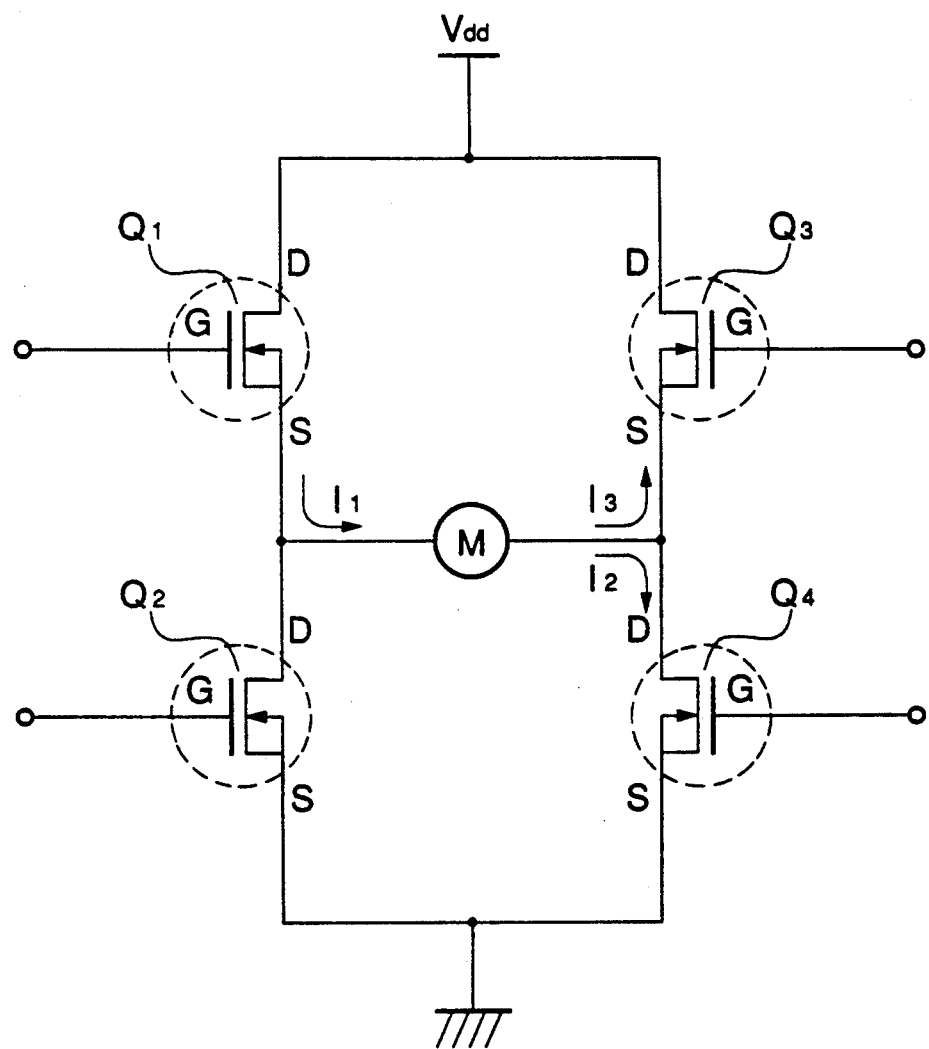
FIG. 1 is a circuit diagram of a typical DC servo motor driving circuit using a set of vertical FETs.
Figure 4:
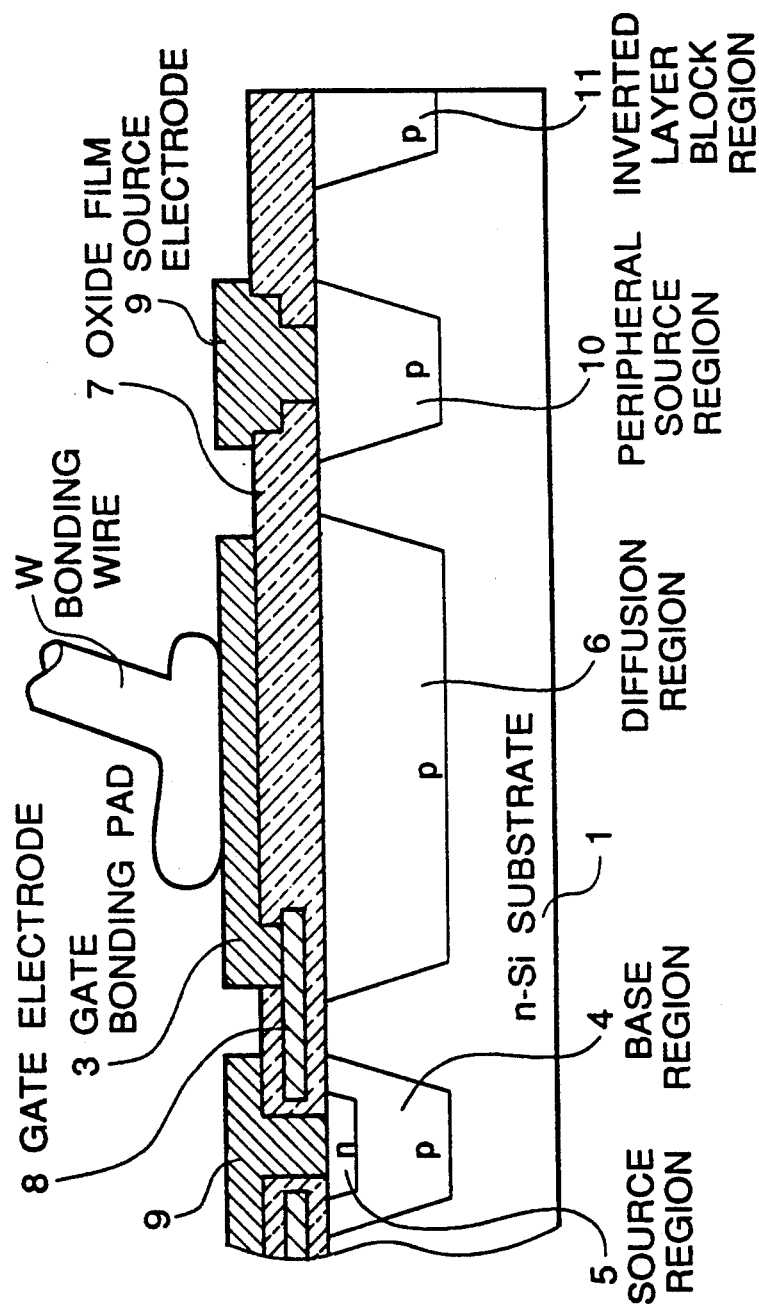
FIG. 4 is a sectional view taken along the line B—B in FIG. 2.

As seen from FIG. 3 showing a sectional view taken along the line A—A in FIG. 2 and FIG. 4 showing a sectional view taken along the line B—B in FIG. 2, the substrate 1 has a rear surface coated with a drain electrode 1A. The substrate 1 also includes a p-type diffusion region (base region) 4 formed in the principal surface in a cell section, and an n-type diffusion region (source region) 5 is formed within the p-type diffusion region 4. The principal surface of the substrate 1 is covered with an oxide film 7, and the source electrode 9 contacts each n-type diffusion region 5 through a contact hole 9A formed in the oxide film 7.

Furthermore, as shown from FIGS. 3 and 4, another p-type diffusion region 6 is formed in the principal surface of the substrate 1 under the gate pad 3 and the gate finger 2, independently of the p-type diffusion region 4. The gate electrode 8 is formed on the oxide film 7 so as to extend from a peripheral portion of the n-type diffusion region 5, over an upper surface portion of the p-type diffusion region 4 which is not covered by the n-type diffusion region 5, and over a portion of the principal surface of the substrate between the p-type diffusion region 4 and the p-type diffusion region 6, to a peripheral portion of the p-type diffusion region 6, as seen from FIGS. 3 and 4.

In addition, the gate finger 2 is formed to overlap and to extend over the gate electrode 8, as shown from FIG. 3. Furthermore, as seen from FIG. 4, the gate pad 3 is formed on the oxide film 7 so as to extend over the p-type diffusion region 6. A bonding wire W is bonded onto the gate pad 3. In addition, the substrate 1 has a peripheral source region 10 of a p-type diffusion region formed apart or separately from the p-type diffusion region 6, so as to form a protection diode between the peripheral source region 10 and the substrate 1. To the peripheral source region 10, the source electrode 9 is also connected. The substrate 1 also has an inversion layer blocking region 11 of a p-type diffusion region.

In the above mentioned structure, the p-type diffusion region 6 under the gate finger 2 shown in FIG. 3 and the p-type diffusion region 6 under the gate pad 3 shown in FIG. 4 are the same continuous diffusion layer, and therefore, are electrically connected to each other. However, the peripheral source region 10 of the p-type diffusion region is electrically isolated from the p-type diffusion region 6 under the gate finger 2 and the gate pad 3.

The above mentioned FET operates as follows:

As mentioned above, since the p-type diffusion region 6 under the gate finger 2 and the gate pad 3 is electrically isolated from the peripheral source region 10 of the p-type diffusion region connected to the source electrode 9, the p-type diffusion region 6 is not biased by the source potential, and therefore, the pn junction between the substrate and the p-type diffusion region 6 under the gate finger 2 and the gate pad 3 does not function as a pn junction diode. Therefore, when carriers are injected, due to the counter electromotive force, from the peripheral p-type diffusion region 10 electrically connected to the source electrode 9, into the n-type drain region (the substrate 1) and then, are drawn from the drain region, the carriers no longer flow through the p-type diffusion region 6 under the gate finger 2 and the gate pad 3. Therefore, after the counter electromotive force has disappeared, namely when the biasing of the FET is restored or returned from a reverse direction to a forward direction, the carrier does not concentrate into the cell section in proximity of the gate bonding pad. Accordingly, the breakdown characteristics against an abrupt current change can be improved.

The above mentioned FET is of an n-channel. But, the present invention can be applied to a p-channel vertical double-diffused FET. In this case, a p-type substrate is used, and an n-type peripheral source diffusion region, an n-type diffusion region under the gate pad and the gate finger, and an n-type base region and a p-type source region in the cell section, are formed in the p-type substrate, respectively. In this p-channel vertical double-diffused FET can improve the breakdown characteristics against an abrupt current change.

Figure 5:
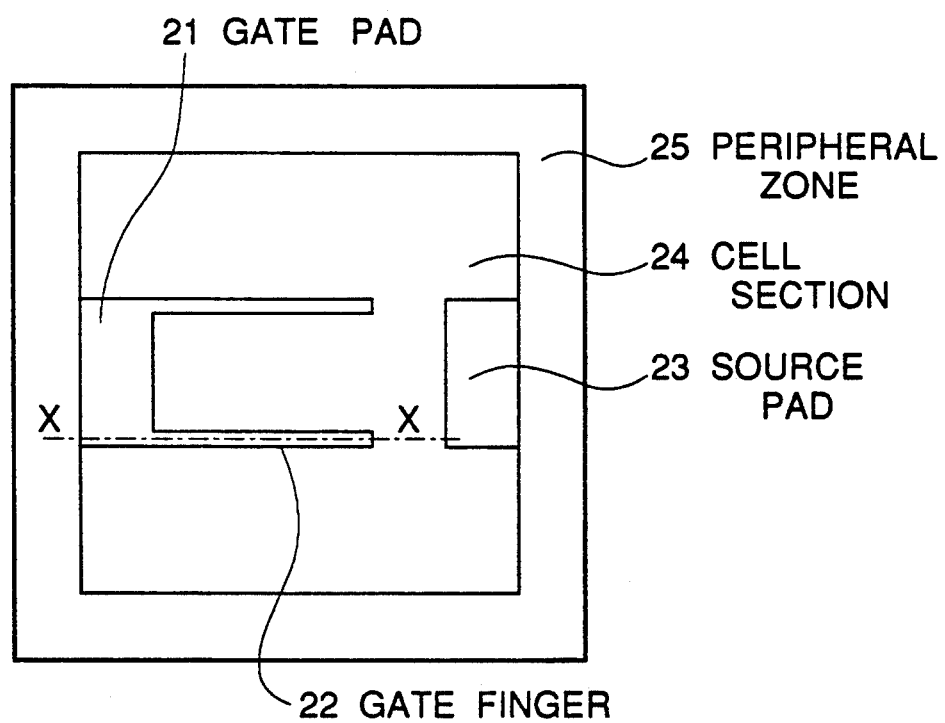
FIG. 5 is plan view of a second embodiment of the vertical double-diffused MOS-FET in accordance with the present invention.

Referring to FIG. 5, there is shown a plan view of a second embodiment of the vertical double-diffused MOS-FET in accordance with the present invention.

As seen from FIG. 5, a gate pad 21, a gate finger 22, a source pad 23, a cell section 24 and a peripheral zone 25 are formed on a principal surface of a semiconductor substrate.

Figure 6:
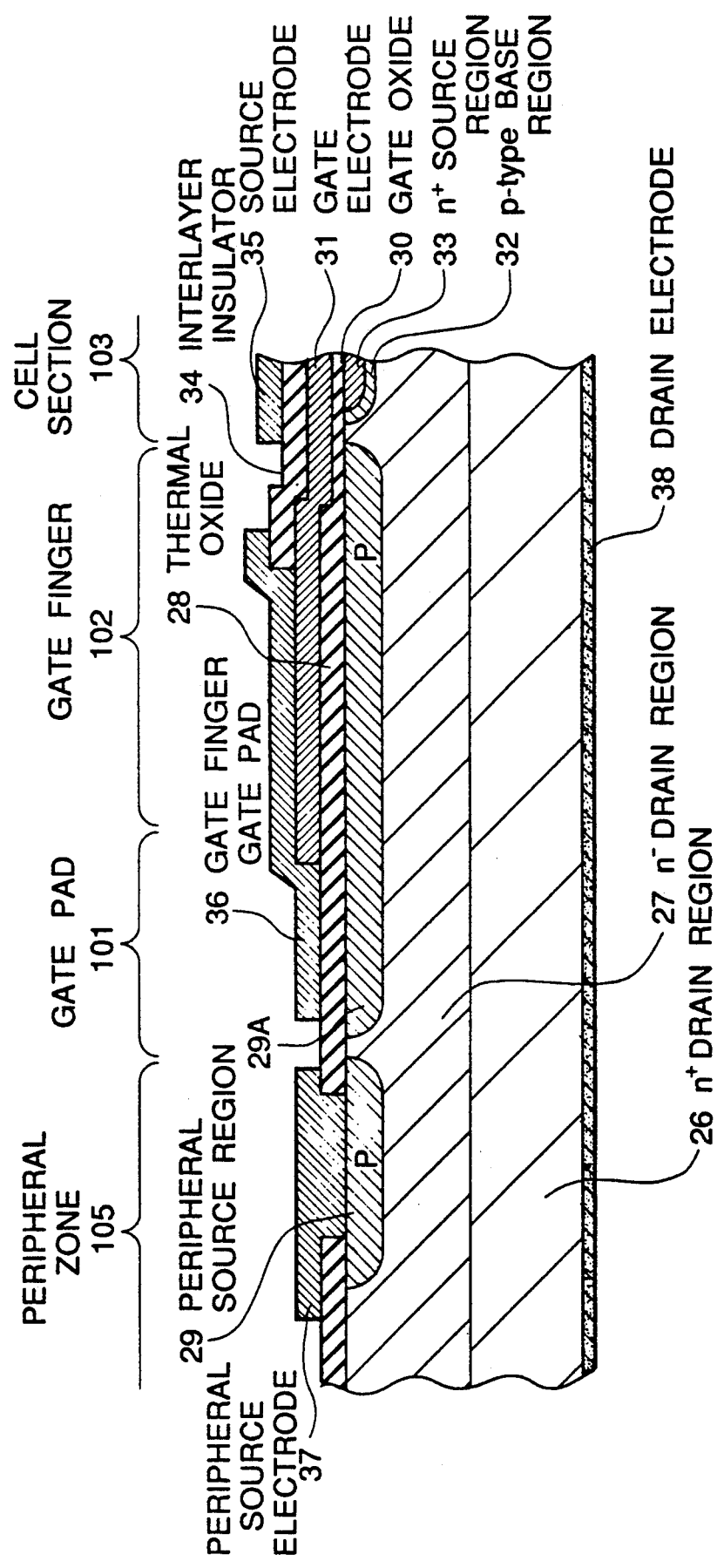
FIG. 6 is a sectional view taken along the line X—X in FIG. 5.

In FIG. 6 showing a sectional view taken along the line X—X in FIG. 5, the substrate is shown by Reference Numeral 26 and is of an n+ silicon substrate. On the n− silicon substrate 26, an n+ layer 27 is formed, and the n+ silicon substrate 26 and the n− layer 27 constitute a drain region. A p-type diffusion region 29 is formed in a portion 105 of the n− layer 27 corresponding to the peripheral zone 25 so that a protection diode is formed between the p-type diffusion region 29 and the n− layer 27, and another p-type diffusion region 29A is formed to extend over a portion 101 of the n− layer 27 corresponding to the gate pad 21 and a portion 102 of the n− layer 27 corresponding to the gate finger 22. In addition, a p-type base region 32 is formed in a portion 103 of the n− layer 27 corresponding to the cell section 24, and an n+ source region 33 is formed in the p-type base region 32.

A gate oxide 30 is formed to start from the n+ source region 33 and to cover the p-type base region 32 and a portion of the n− layer 27 between the p-type base region 32 and the p-type diffusion region 29A, and then to reach a peripheral portion of the p-type diffusion region 29A. A thermal oxide film 28 is formed to cover the remaining surface of the n− layer 27. A gate electrode 31 of a polysilicon is formed on the gate oxide 30 and a portion of the thermal oxide film 28. An aluminum conductor 36 is deposited on another portion of the thermal oxide film 28 and a portion of the gate electrode 31 above the p-type diffusion region 29A, so as to form the gate pad 1 and the gate finger 2. In addition, an aluminum conductor 37 is formed on the thermal oxide film 28 above the p-type diffusion region 29 and is electrically connected to the p-type diffusion region 29 through a contact hole formed in the thermal oxide film 28. The aluminum conductor 37 constitutes a peripheral source electrode.

In the cell section 103, an interlayer insulating layer 34 is formed on the gate electrode 31, and a source electrode 35 of an aluminum is formed on the interlayer insulating layer 34 and is connected to the source region 33 by a not-shown contact hole. A drain electrode 38 is formed on a rear surface of the substrate 6.

In order to prevent a breakdown due to the parasitic transistor, it is one solution to suppress the amount of carriers injected into the semiconductor substrate. If the diffusion region 29A under the gate pad 21 and the gate finger 22 is formed continuously to the peripheral protection diode, the minority carriers are injected not only from the diffusion region 29 under the peripheral source electrode 37 (peripheral protection diode), but also from the diffusion region 29A under the gate pad 21 and the gate finger 22. However, if the diffusion region 29A under the gate pad 21 and the gate finger 22 is separated or isolated from the peripheral protection diode, the minority carriers are injected only from the diffusion region 29 of the peripheral protection diode, and therefore, the amount of injected carriers is reduced. As a result, the switching speed can be increased.

In the conventional vertical field effect transistor, the diffusion region under the gate pad and the gate finger has been formed continuously to the peripheral protection diode and has been connected to the source electrode, in order to ensure connection of depletion layers between cell sections under the gate finger. However, even if the diffusion region under the gate finger is separated or isolated from the peripheral protection diode, an actual normal operation is that a reverse-biased voltage is applied between the drain region and the diffusion region under the gate finger and the diffusion region of the peripheral protection diode, and therefore, a depletion layer is formed to extend into the drain region. As a result, the depletion layer extending from the diffusion region under the gate finger joins with the depletion layer extending from the diffusion region of the peripheral protection diode, and therefore, the diffusion region under the gate finger and the diffusion region of the peripheral protection diode are maintained at the same potential.

Therefore, if the diffusion region under the gate finger and the diffusion region of the peripheral protection diode are separated from each other at any distance within a range which can ensure that the depletion layers of the diffusion region under the gate finger and the diffusion region of the peripheral protection diode are continuously coupled, when a forward biasing voltage is applied between the drain region and the diffusion region under the gate finger and the diffusion region of the peripheral protection diode, since no depletion layer extends from each of the diffusion region under the gate finger and the diffusion region of the peripheral protection diode, the diffusion region under the gate finger and the diffusion region of the peripheral protection diode are automatically isolated from each other. Accordingly, if the diffusion region under the gate finger and the diffusion region of the peripheral protection diode are separated from each other within the above mentioned distance range, the diffusion region under the gate finger will never lose its inherent function, and in addition, the injection of minority carriers in proximity of the cell section can be prevented. The distance between the diffusion region under the gate finger and the diffusion region of the peripheral protection diode is preferred to be not less than 1 μm but not greater than 60 μm.

Furthermore, when the diffusion region under the gate finger and the gate pad is separated from the diffusion region of the peripheral protection diode, if the distance of separation can ensure that the depletion layers are formed continuously to each other, the breakdown voltage can be increased. The reason for this is that: when the depletion layers are formed, if the depletion layers are independent of each other, each formed depletion layer has a high curvature, and therefore, an electric field is apt to be concentrated. However, if adjacent depletion layers are adjoined or coupled to each other, the adjoined depletion layer has a low curvature, and therefore, has an increased breakdown voltage.

The width W of the generated depletion layer can be expressed as follows if it is approximated by a single side stepped coupling:

$$W = \{(2\epsilon_s V_{DS})/(q N_D)\}^{\frac{1}{2}}$$

where
$\epsilon_s$ is dielectric constant of the silicon of the substrate
$V_{DS}$ is a source/drain voltage
q is electric charge unit amount
$N_D$ is the concentration of the n− drain The dielectric constant $\epsilon_s$ of the silicon of the substrate is $1.05 \times 10^{-12}$ F/cm, and the electric charge unit amount q is $1.602 \times 10^{-19}$ C. The concentration $N_D$ of the n− drain and the source/drain voltage $V_{DS}$ are determined by a breakdown voltage. In the case of the breakdown voltage of 600 V, the width of the depletion layer can be calculated to be about 62.8 μm. Accordingly, the distance between the diffusion region under the gate finger and the gate pad and the diffusion region of the peripheral protection diode is preferably set at a value of not greater than 60 μm which is slightly smaller than 62.8 μm. On the other hand, the shorter the distance is, it is more preferable. Therefore, it is preferably to set the distance within a range from 2 μm (limit in manufacturing) to 10 μm.

Now, an actual example will be described

In the case of the breakdown voltage of 600 V, the n+ silicon substrate 26 doped with antimony at the concentration of $2 \times 10^{18}$/cm$^3$ is used, and an n− silicon layer 27 having the thickness of about 65 μm and doped with phosphorus to have the resistivity of 25 Ωcm (concentration: $2\times 10^{14}/cm^3$) is epitaxially grown on the n+ silicon substrate 26.

The diffusion regions 29 and 29B are formed by ion-implanting boron ions at the dose of $1\times 10^{14}/cm^2$ under the acceleration voltage of 70 KeV, and then by heat-treating at about 1200° C. for about 60 minutes for facilitating diffusion. In this case, a surface concentration is about $1.3\times 10^{18}/cm^3$ and the junction depth is about 3 μm.

Thereafter, for protection of the surface, the thermal oxide film 28 is formed to have a thickness of about 8000 Å, and then, selectively removed by a photoresist process from only a zone on which the gate oxide 30 is to be formed. Furthermore, the gate oxide 30 having the thickness of about 1200 Å is formed, and a polysilicon layer having the thickness of about 6000 Å is deposited by a LPCVD (low pressure chemical vapor deposition) process. Phosphorus is diffused into the deposited polysilicon layer so as to have a sheet resistance of about 11 $\Omega/\square$, and the deposited polysilicon layer is selectively removed by a photoresist process so as to form the gate electrode 31.

For formation of the p-type base region 32, boron is ion-implanted at the dose of $5\times 10^{13}/cm^2$ under the acceleration voltage of 70 KeV, using the gate electrode 31 as a mask, and the heat-treating is conducted at about 1200° C. for about 60 minutes for facilitating diffusion. In this case, a surface concentration is about $6.3\times 10^{17}/cm^3$ and the junction depth is about 2.8 μm. This doped region extends partially under the gate electrode 31.

For formation of the n+ source region 33, arsenic is ion-implanted at the dose of $1\times 10^{16}/cm^2$ under the acceleration voltage of 80 KeV, using another mask, and the heat-treating is performed at about 1000° C. for about 30 minutes for facilitating diffusion. In this case, a surface concentration is about $1\times 10^{20}/cm^3$ and the junction depth is about 0.3 μm.

Thereafter, the interlayer insulator 14 having the thickness of about 10000 Å is deposited by a CVD (chemical vapor deposition) process, and a contact hole is formed by a photoresist process. Then, an aluminum film having the thickness of about 3.5 μm is deposited by an evaporation process or a sputtering process, and patterned by a photoresist process so as to form the source electrode 35, the peripheral source electrode 37 and the gate finger and gate pad 36.

Thereafter, the drain electrode 38 is formed on the rear surface of the substrate 6.

Thus, the p-type diffusion region 29A is isolated from the n- drain region or layer 37 by a pn junction, but is maintained at a floating potential, since the p-type diffusion region 29A is connected to neither the gate electrode 31 nor the source electrode 37.

In the above mentioned structure, when the diffusion region under the gate pad and the gate finger is biased in a forward direction to the drain region, since the diffusion region under the gate pad and the gate finger is maintained at a floating potential, the pn junction between the drain region and the diffusion region under the gate pad and the gate finger does not functions as the diode. Accordingly, even if the diode between the drain and the peripheral source region is biased in the forward direction to the effect that the n- drain region is at a positive voltage as compared with the source region, the minority carriers are not injected into the diffusion region under the gate pad and the gate finger. Thus, when the counter electromotive force disappears, namely, when the bias of the FET is returned from an reverse condition to a forward condition, the minority carriers do not flow in the proximity of the cell section, and therefore, the operation of the bipolar transistor parasitic to the cell section is suppressed. Accordingly, the breakdown voltage change rate is remarkably increased.

In the case of the vertical field effect transistor having the chip size of about 2.8 mm square and the breakdown voltage of 600 V, the breakdown voltage change rate (a slope of the drain/source voltage when the bias of the FET is returned from a reverse condition to a forward condition after a forward direction current of 4 A is applied) is 2 V/nS in the conventional structure, and 4 V/nS in the disclosed structure.

In addition, since the parasitic capacitance is reduced, all of an input capacitance, a feedback capacitance and an output capacitance are reduced by about 30%, and the switching speed can be increased by about 30%.

The invention has thus been shown and described with reference to the specific embodiments. However, it should be noted that the present invention is in no way limited to the details of the illustrated structures but changes and modifications may be made within the scope of the appended claims.

We claim:

1. A vertical field effect transistor of the structure having a gate pad and a gate finger, the vertical field effect transistor including:
   a semiconductor substrate of a first conduction type having an upper principal surface and a lower principal surface;
   a drain electrode formed on said lower principal surface of said semiconductor substrate in electrical contact with said lower principal surface;
   an insulating film coated to cover said upper principal surface of said semiconductor substrate, said gate pad and said gate finger being formed above said insulating film;
   a first diffusion region of a second conduction type opposite to said first conduction type, formed in said upper principal surface of said substrate under said gate pad and said gate finger;
   a base region of said second conduction type formed in said principal surface of said substrate, separated from said first diffusion region;
   a source region of said first conduction type formed within said base region;
   a source electrode formed on said insulating film and in electrical contact with said source region through a contact hole formed in said insulating film;
   a gate electrode formed on said insulating film to extend from said source region, over said base region and said upper principal surface of said substrate which are positioned between said source region and said first diffusion region, to a peripheral portion of said first diffusion region, said gate electrode being electrically connected to said gate pad and said gate finger; and
   a second diffusion region of said second conduction type formed in said principal surface of said substrate and electrically connected to said source electrode so as to form a protection diode between said substrate and said second diffusion region, said second diffusion region being electrically isolated from said first diffusion region, so that said first diffusion region is floating.

2. A semiconductor device including:

a semiconductor substrate of a first conduction type having an upper principal surface and a lower principal surface;

a drain electrode formed on said lower principal surface of said semiconductor substrate in electrical contact with said lower principal surface;

an insulating film coated to cover said upper principal surface of said semiconductor substrate;

a base region formed in said upper principal surface of said substrate and having a second conduction type opposite to said first conduction type;

a source region formed adjacent to said base region in said upper principal surface of said substrate and having said first conduction type;

a gate electrode formed on said insulating film to extend from said source region, over said base region, and over said upper principal surface of said substrate positioned between said source region and said first diffusion region;

a gate finger formed to extend on said gate electrode and electrically connected to said gate electrode;

a gate pad formed in electrical connection to said gate finger;

a source electrode formed on said insulating film and in electrical connection to said source region through a contact hole formed in said insulating film;

a first semiconductor region of said second conduction type formed in said substrate and electrically connected to said source electrode, said first semiconductor region forming a protection diode between said first semiconductor region and said substrate;

a second semiconductor region of said second conduction type formed in said substrate directly under at least said gate finger, said second semiconductor region being separated from said first semiconductor region so that said second semiconductor region of said second conduction type is electrically isolated from said first semiconductor region of said second conduction type by said substrate of said first conduction type, so that said second semiconductor is floating.

3. A semiconductor device claimed in claim 2 wherein said first semiconductor region is separated from said second semiconductor region by a distance which is shorter than a thickness of a depletion layer formed by said first semiconductor region and said second semiconductor region, respectively.

4. A semiconductor device claimed in claim 2 wherein said first semiconductor region is separated from said second semiconductor region by a distance within a range of not less than 1 $\mu$m but not greater than 60 $\mu$m.

5. A semiconductor device claimed in claim 2 wherein a drain electrode is formed on a rear surface of said substrate, so that a vertical field effect transistor is constituted.

* * * * *